United States Patent
Masumoto

(10) Patent No.: US 7,754,528 B2
(45) Date of Patent: Jul. 13, 2010

(54) METHOD FOR THIN SEMICONDUCTOR PACKAGES

(75) Inventor: Mutsumi Masumoto, Beppu (JP)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 12/332,063

(22) Filed: Dec. 10, 2008

(65) Prior Publication Data
US 2009/0087946 A1 Apr. 2, 2009

Related U.S. Application Data

(62) Division of application No. 11/299,594, filed on Dec. 12, 2005, now abandoned.

(51) Int. Cl.
*H01L 21/60* (2006.01)
(52) U.S. Cl. .................. 438/107; 257/E21.51
(58) Field of Classification Search .......... 438/107; 257/21.51
See application file for complete search history.

(56) References Cited

U.S. PATENT DOCUMENTS

2004/0219719 A1* 11/2004 Yoneda et al. .............. 438/123
2005/0194676 A1* 9/2005 Fukuda et al. .............. 257/698

* cited by examiner

*Primary Examiner*—Matthew Smith
*Assistant Examiner*—Walter H Swanson
(74) *Attorney, Agent, or Firm*—Yingsheng Tung; Wade J. Brady, III; Frederick J. Telecky, Jr.

(57) ABSTRACT

A semiconductor device (100) has one or more semiconductor chips (110) with active and passive surfaces, wherein the active surfaces include contact pads. The device further has a plurality of metal segments (111) separated from the chip by gaps (120); the segments have first and second surfaces, wherein the second surfaces (111b) are coplanar (130) with the passive chip surface (101b). Conductive connectors span from the chip contact pads to the respective first segment surface. Polymeric encapsulation compound (150) covers the active chip surface, the connectors, and the first segment surfaces, and are filling the gaps so that the compound forms surfaces coplanar (130) with the passive chip surface and the second segment surfaces. In this structure, the device thickness may be only about 250 μm. Reflow metals may be on the passive chip surface and the second segment surfaces.

14 Claims, 5 Drawing Sheets

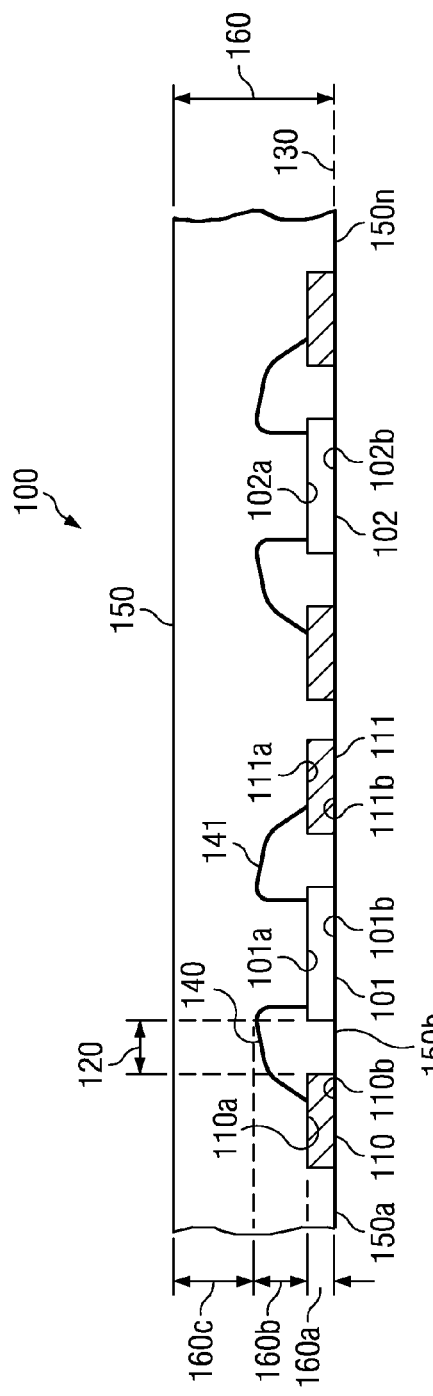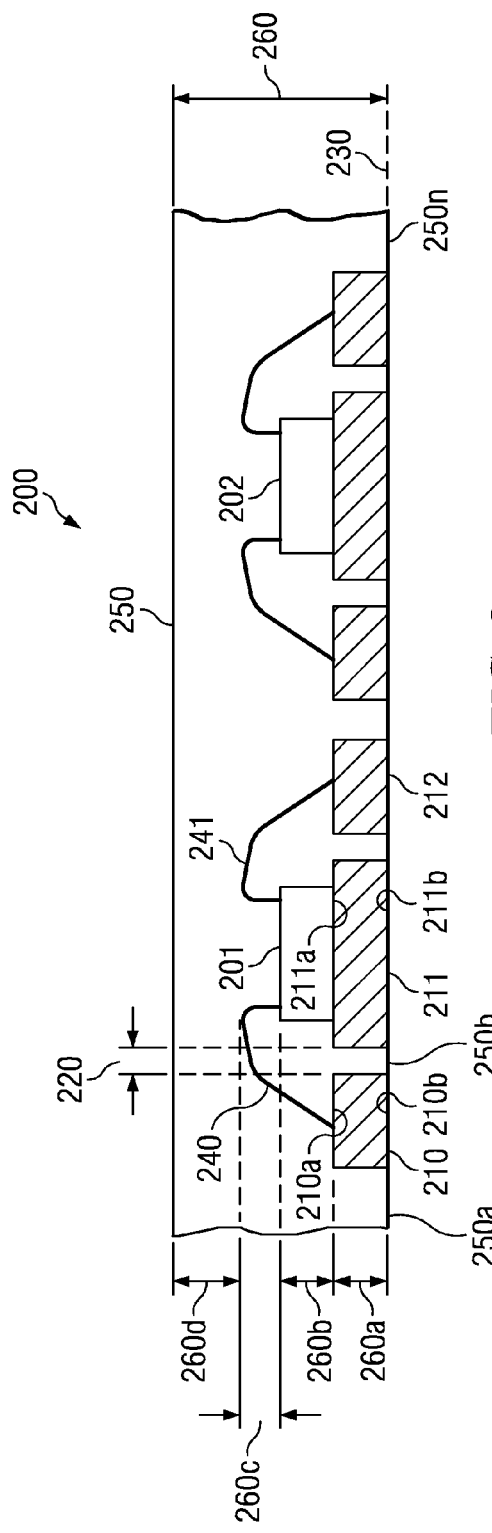

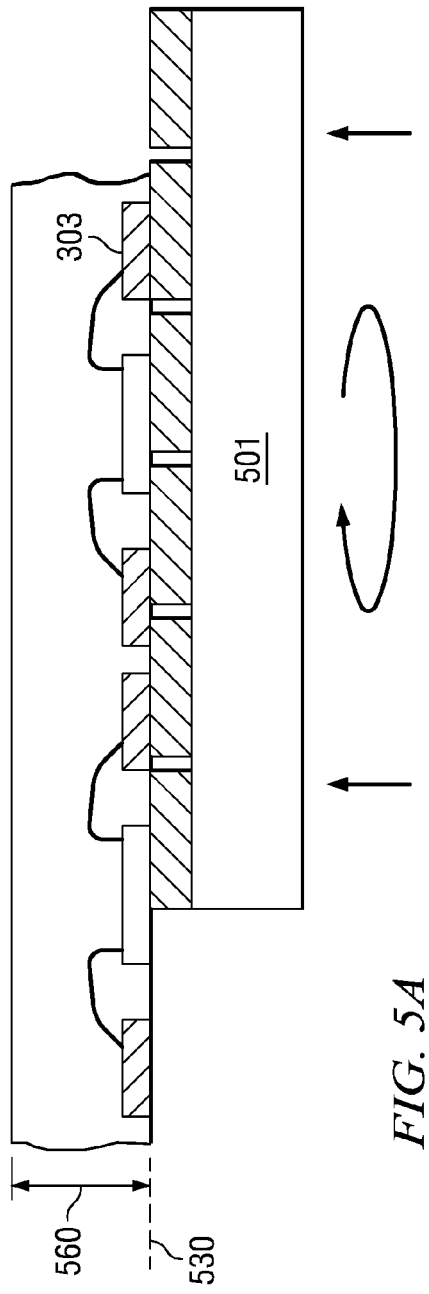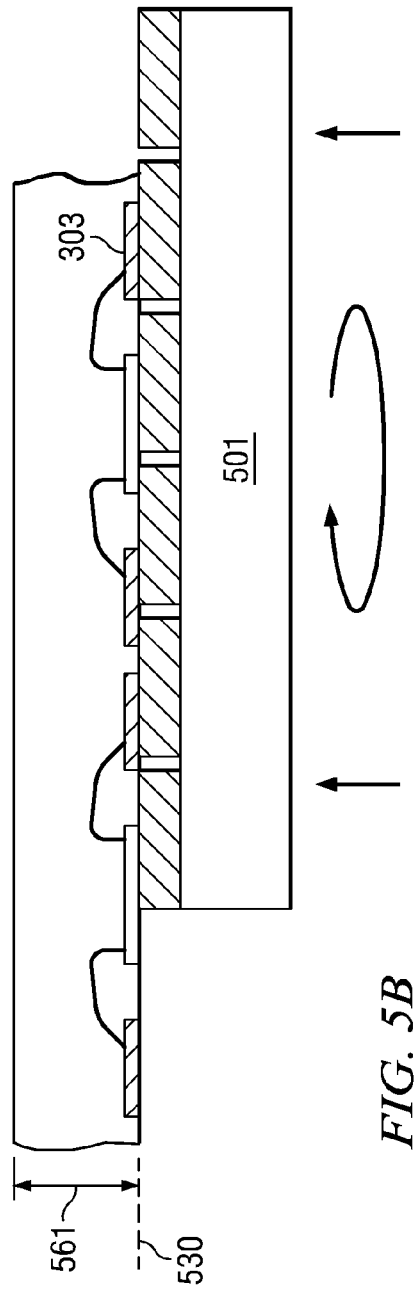

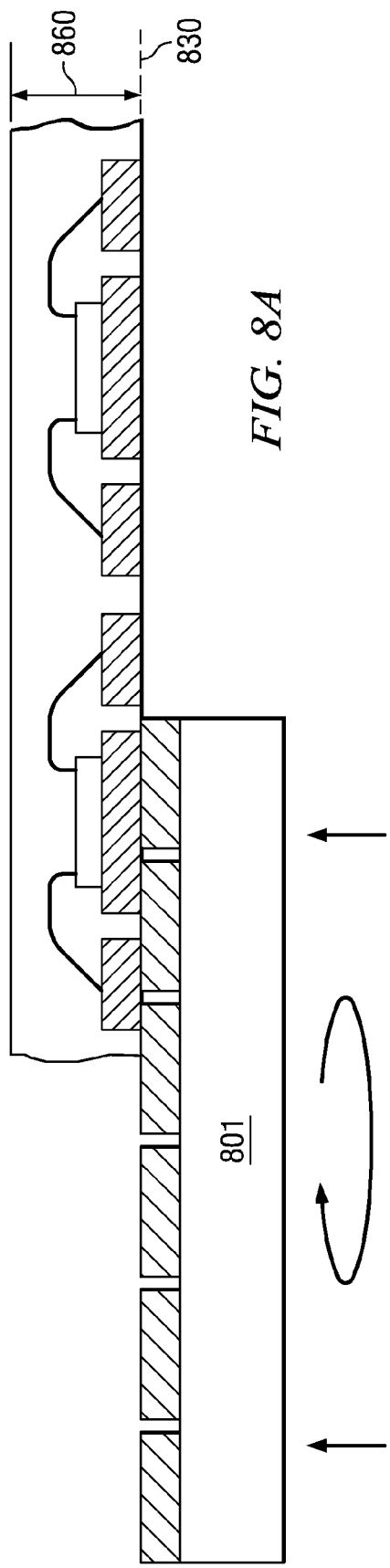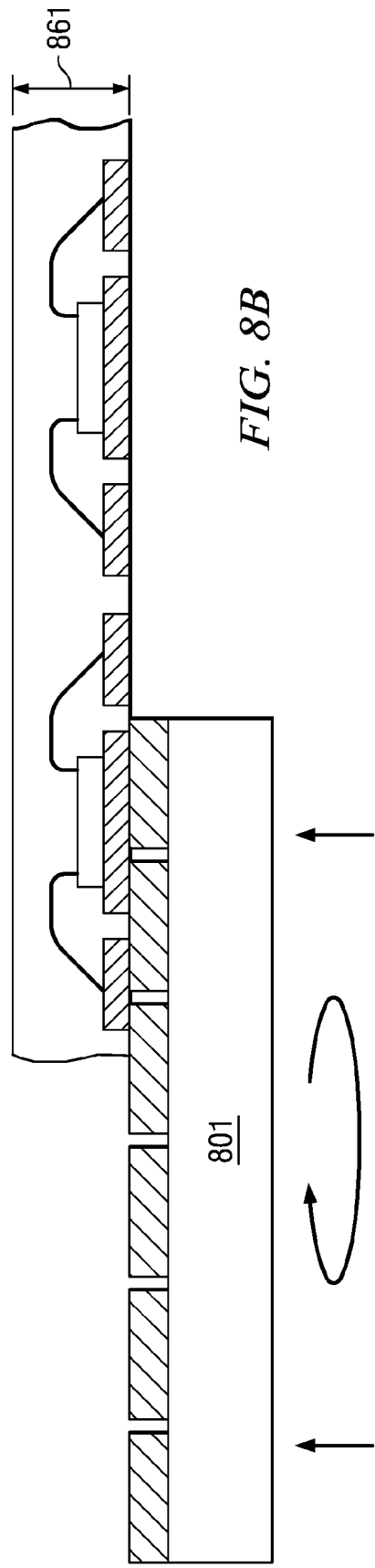

METHOD FOR THIN SEMICONDUCTOR PACKAGES

This application is a division of U.S. application Ser. No. 11/299,594, filed Dec. 12, 2005, the entirety of which is incorporated herein by reference.

FIELD OF THE INVENTION

The present invention is related in general to the field of semiconductor devices and processes, and more specifically to structure and method of thin single or multichip semiconductor QFN devices.

DESCRIPTION OF THE RELATED ART

Leadframes for semiconductor devices provide a stable support pad for firmly positioning the semiconductor chip, usually an integrated circuit (IC) chip, within a package. It has been common practice to manufacture single piece leadframes from thin (about 120 to 250 µm) sheets of metal. For electrical and thermal reasons, copper has been the favorite starting material; however, the copper price has recently been climbing sharply.

In addition to the chip pad, the leadframe offers a plurality of conductive segments to bring various electrical conductors into close proximity of the chip. The remaining gaps between the segments and the contact pads on the chip surface are bridged by connectors, typically thin metal wires of gold, individually bonded to the chip contact pads and the leadframe segments. Consequently, the surface of the inner segment ends has to be metallurgically suitable for attaching the connectors.

The end of the lead segments remote from the chip need to be electrically and mechanically connected to external circuitry such as printed circuit boards. This attachment is customarily performed by soldering, conventionally with a tin alloy solder at a reflow temperature above 200° C. Consequently, the surface of the outer segment ends needs to have a metallurgical configuration suitable for reflow attachment to external parts.

Finally, the leadframe provides the framework for encapsulating the sensitive chip and fragile connecting wires. Encapsulation using plastic materials has been the preferred method due to low cost. The transfer molding process for epoxy-based thermoset compounds at 175° C. has been practiced for many years. The temperature of 175° C. for molding and mold curing (polymerization) is compatible with the temperature of >200° C. for eutectic solder reflow.

Reliability tests in moist environments require that the molding compounds have good adhesion to the leadframe and the device parts it encapsulates. Two major contributors to good adhesion are the chemical affinity between the molding compound and the metal finish of the leadframe, and the surface roughness of the leadframe.

In recent years, a number of technical and market trends have made it more and more difficult to find satisfactory solutions for the diverse requirements. As an example, the package dimensions are shrinking, offering less surface for adhesion. Then, the requirement to use lead-free solders pushes the reflow temperature range into the neighborhood of about 260° C., making it more difficult to maintain mold compound adhesion to the leadframes. This is especially true for the small leadframe surfaces available in QFN (Quad Flat No-lead) and SON (Small Outline No-lead) devices. ICs are becoming faster; consequently, they dissipate more thermal energy, which needs to be removed to maintain optimum operating temperatures. The dimensions of semiconductor packages, especially the thickness, have to shrink since they need to fit into small, often handheld end-equipment. And the package manufacturing cost must come down to compensate for rising material prices and market pressures on the product cost.

SUMMARY OF THE INVENTION

Applicant recognizes the need for a fresh concept of achieving low-cost device fabrication using leadframe structures tailor-made for thin semiconductor packages and high reliability devices. The low-cost leadframes are to offer a combination of adhesion to molding compounds, bondability for connecting wires, solderability of the exposed leadframe segments, and short paths for thermal power dissipation.

There are technical advantages, when the leadframe and its method of fabrication are flexible and low cost enough to be applied for different semiconductor product families and a wide spectrum of design and assembly variations, and achieve improvements toward the goals of improved process yields, high manufacturing throughput, and device reliability. Of special interest are solutions, which can be applied to single and multi-chip products. There are further technical advantages, when these innovations are accomplished using the installed equipment base so that no investment in new manufacturing machines is needed.

One embodiment of the invention is a semiconductor device, which has one or more semiconductor chips with active and passive surfaces, wherein the active surfaces include contact pads. The device further has a plurality of metal segments separated from the chip by gaps; the segments have first and second surfaces, wherein the second surfaces are flat and coplanar with the passive chip surface. Conductive connectors span from the chip contact pads to the respective first segment surface. Polymeric encapsulation compound covers the active chip surface, the connectors, and the first segment surfaces, and are filling the gaps so that the compound forms surfaces coplanar with the passive chip surface and the second segment surfaces. In this structure, the device thickness may be only about 250 µm. Reflow metals may be on the passive chip surface and the second segment surfaces.

Another embodiment of the invention is a method for fabricating semiconductor devices. Using a metal sheet with first and second surfaces, selected portions of the first sheet surface are etched so that they become gaps with a certain depth and selected lengths and widths between un-etched metal segments. Semiconductor chips with contact pads are attached in gaps of suitable length and width. The chip contact pads are connected to respective segments using conductive connectors. The first sheet surface including the assembled chips and connectors are covered with a polymeric compound, which also fills the remaining gaps. Mechanical grinding is then applied to the second sheet surface in order to remove metal until the certain depth of the gaps is reached. The segments are thus electrically isolated from each other, and a planar device surface is created. The grinding process may be continued until a predetermined thinness of segments and chips is reached, for some devices as low as about 250 µm.

Another embodiment of the invention is another method for fabricating semiconductor devices. Using a metal sheet with first and second surfaces, selected portions of the first sheet surface are etched so that they become gaps with a certain depth and selected lengths and widths between un-etched metal segments; the segments are suitable for attaching semiconductor chips or metal connectors. Chips with contact pads are attached to suitable segments, and chip contact pads are connected to respective segments using conductive connectors. The first sheet surface including the assembled chips and connectors are covered with a polymeric compound, which also fills the gaps. Mechanical grinding is then applied to the second sheet surface in order to remove metal until the certain depth of the gaps is reached. The segments are thus electrically isolated from each other, and a planar device surface is created. The grinding process may be continued until a predetermined thinness of the segments is reached, for some devices as low as about 375 µm.

It is an advantage that the grinding technique does not require specific powders, rinsing or cleaning, and the grinding rate is equal for the involved metals, polymers, and semiconductors. The employed technique is easy to control, an advantage for fabricating ultra-thin packages.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 1 shows a schematic cross section of a device of the multichip QFN/SON type having a structure fabricated by a method according to the invention.

FIG. 2 shows a schematic cross section of another device of the multichip QFN/SON type having a structure fabricated by a method according to the invention.

FIGS. 3 to 5B are schematic cross sections to illustrate method steps for an embodiment of the invention.

FIG. 3 depicts a metal sheet after partial etching.

FIG. 4 illustrates semiconductor chips after assembling on the partially etched metal sheet, and after encapsulating.

FIG. 5A shows the device after the first phase of mechanical grinding.

FIG. 5B shows the device after the second phase of mechanical grinding.

FIGS. 6 to 8B are schematic cross sections to illustrate method steps for another embodiment of to the invention.

FIG. 6 depicts a metal sheet after partial etching.

FIG. 7 illustrates semiconductor chips after assembling on the partially etched metal sheet, and after encapsulating.

FIG. 8A shows the device after the first phase of mechanical grinding.

FIG. 8B shows the device after the second phase of mechanical grinding.

DETAILED DESCRIPTION OF THE PREFERRED EMBODIMENTS

Figure 3:
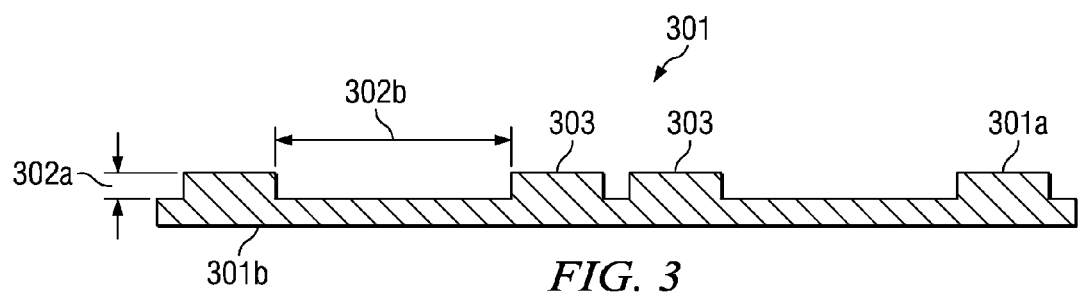

FIGS. 1 and 2 are schematic cross sections of embodiments of the present invention. FIG. 1 shows a multichip device of the QFN (Quad Flat No-lead) or SON (Small Outline No-lead) family, generally designated 100, with two similar chips 101 and 102. It should be stressed, however, that the considerations about device 100 are equally valid, when device 100 contains only a single chip, or more than two chips; also, the considerations are equally valid, when the chips of a multichip device are dissimilar or belonging to different product families.

Using chip 101 as an example, FIG. 1 illustrates chip 101 having an active surface 101a and a passive surface 101b. The active surface 101a includes contact pads suitable for affixing conductive connectors. In analogy, chip 102 has an active surface 102a with contact pads, and a passive surface 102b.

Device 100 in FIG. 1 further has a plurality of metal segments 110, 111, etc., which are separated from chips 101 and 102 by gaps, and by other gaps from each other. For instance, segment 110 is separated from chip 101 by gap 120. The segments have first and second surfaces; for example, segment 110 has first surface 110a and second surface 110b; and segment 111 has first surface 111a and second surface 111b. The second surfaces 110b, 111b, etc., are coplanar with the passive chip surface 101b, and furthermore with passive chip surface 102b and the second surfaces of all other segments. With other words, all chip passive surfaces and all segment second surfaces are in the same plane 130.

Conductive connectors are spanning from the chip contact pads to the first surface of the respective segment. In FIG. 1, the connectors are bond wires; for instance, one contact pad of chip 101 is shown connected to segment 110 by wire 140, and the other contact pad connected by wire 141 to segment 111.

Polymeric encapsulation compound 150, preferably an epoxy-based molding compound, covers the active chip surfaces 101a and 102a, the connectors 140, 141, etc., and the first segment surfaces 110a, 111a, etc. In addition, encapsulation compound 150 fills the gaps 120 etc. so that the compound forms surfaces 150a, 150b . . . 150n coplanar with the passive chip surfaces 101b and 102b and the second segment surfaces 110b, 111b, etc. With other words, all chip passive surfaces, all segment second surfaces and the surfaces of the gap-filling compound are in the same pane 130.

Devices as depicted in FIG. 1 can be fabricated with very slim thickness 160. As an example, with segment thickness 160a of 75 µm, wire span loop height 160b of 75 µm, and encapsulation compound thickness 160c over the wire span of 100 µm, the total device thickness 160 is only 250 µm. In this example, the thickness of the semiconductor chips may be 100 µm or even only 75 µm.

For many applications, it is preferred to provide the connection to external parts using solder reflow alloys. To this end, reflow material (for example, solder balls or solder paste) is attached to the second segments surfaces 110b, 111b, etc., and preferably also to the passive chip surfaces 101b and 102b. For other applications, the connection to external parts is accomplished by pressure contacts.

For some applications, it is advantageous to include at least one passive component inside of the encapsulation compound.

Another embodiment of the invention is illustrated in FIG. 2 as a multichip device of the QFN or SON type, generally designated 200. The embodiment is shown with two chips 201 and 202, which may be similar or different. It should be stressed, however, that the considerations about device 200 are equally valid, when device 200 contains only a single chip, or more than two chips. The active surfaces of chips 201 and 202 have contact pads.

Device 200 has a plurality of metal segments 210, 211, 212, etc., which are separated from each other by gaps. For instance, segment 210 is separated from segment 211 by gap 220. The segments have first and second surfaces; for example, segment 210 has first surface 210a and second surface 210b; and segment 211 has first surface 211a and second surface 211b. The second surfaces 210b, 211b, etc., are coplanar; all segment second surfaces are in the same plane 230.

The first segment surfaces are suitable for attaching semiconductor chips or conductive connectors. In the example of FIG. 2, the first surface 210a of segment 210 is suitable for attaching a bond wire; the first surface 211a of segment 211 has an area suitable for attaching the passive surface of semiconductor chip 201.

Conductive connectors are spanning from the chip contact pads to the first surface of the respective segment. In FIG. 2, the connectors are bond wires; for instance, one contact pad of chip 201 is shown connected to segment 210 by wire 240, and the other contact pad connected by wire 241 to segment 212.

Polymeric encapsulation compound 250, preferably an epoxy-based molding compound, covers the active chip surfaces, the connectors 240, 241, etc., and the first segment surfaces 210a, 211a, etc. In addition, encapsulation compound 250 fills the gaps 220 etc. so that the compound forms surfaces 250a, 250b . . . 250n coplanar with the second segment surfaces 210b, 211b, etc. All segment second surfaces and the surfaces of the gap-filling compound are in the same pane 230.

Devices as depicted in FIG. 2 can be fabricated with slim thickness 260. As an example, with segment thickness 260a of 100 µm, chip thickness 260b of 100 µm, wire span loop height 260c of 75 µm, and encapsulation compound thickness 260d over the wire span of 100 µm, the total device thickness 260 is only 375 µm.

For many applications, it is preferred to provide the connection to external parts using solder reflow alloys. To this end, reflow material (for example, solder balls or solder paste) is attached to the second segments surfaces 210b, 211b, etc. For other applications, the connection to external parts is accomplished by pressure contacts.

For some applications, it is advantageous to include at least one passive component inside of the encapsulation compound.

Other embodiments of the present invention are methods for fabricating semiconductor devices. Specifically, FIGS. 3 to 5B illustrate steps of the fabrication process for devices of the structure displayed in FIG. 1, and FIGS. 6 to 8B depict steps of the fabrication process for devices of the structure displayed in FIG. 2. In both fabrication methods, a metal sheet is provided, which has first and second surfaces. Preferred sheet metals are copper or copper alloys; alternative metals include aluminum, iron-nickel alloys, and Kovar. The preferred metal sheet thickness is in the range from 100 to 300 µm; thinner sheets are possible, but not necessary, since the sheets will be thinned at end of the process by grinding (see below). The ductility in this thickness range provides the 5 to 15% elongation that facilitates the segment bending and forming operation needed for some of the finished devices (for instance, for surface mount devices).

Referring now to FIG. 3, selected portions of the first surface 301a of sheet 301 are etched so that the etched portions become gaps with a certain depth 302a and selected length 302b and width (not shown in the cross section of FIG. 3) between un-etched metal segments 303. The depth, length and width of the gaps are predetermined to accommodate semiconductor chips, and the segments are predetermined (metallurgically suitable) for attaching metal connectors on first surface 301a. The sheet portion left after the etch step acts as sort of "carrier" and includes the second surface 301b of the sheet.

Figure 4:
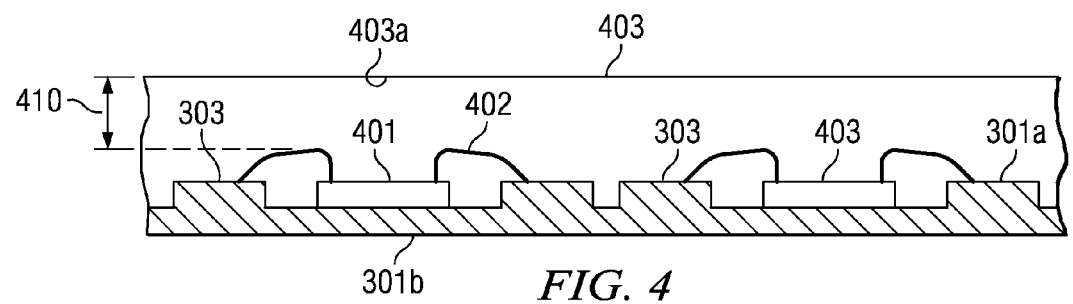

In the next process step, semiconductor chips with contact pads are provided; the number of required chips is determined by the final product (single chip or multi-chip device). Each chip is placed in a gap of suitable length and width, and attached to the etched metal sheet. FIG. 4 illustrates examples for chips 401, which fit easily in the length 302b of the etched gaps. The thickness of chips 401 may be equal to, or smaller or larger than depth 302a.

FIG. 4 also shows the next process step of interconnecting the chip contact pads with the respective segments 303 using conductive connectors 402. Preferred connectors are bond wires made of gold or gold alloy. In addition, FIG. 4 depicts the next process step of covering the first sheet surface 301a, the assembled chips 401, and the connectors 402 with a polymeric compound 403, preferably an epoxy-based molding compound; actually, compound 403 covers the connectors 402 to a height 410 over the wire span to ensure complete protection. For many devices, the top surface 403a of the encapsulation compound is preferably substantially planar and parallel to the second sheet surface 301b. Furthermore, compound 403 is filling the remaining gaps. On the other hand, second sheet surface 301b remains uncovered by the encapsulation compound.

FIGS. 5A and 5B illustrate the mechanical grinding step at two completion stages, FIG. 5A at an earlier completion stage and FIG. 5B at a later completion stage. For the grinding process (described in more detail in conjunction with FIG. 9), a rotating grinding wheel 501 is used similar to the wheel conventionally used in the silicon wafer back-grinding process. The grinding process attacks the second sheet surface 301b (see FIG. 4) and continues to remove metal, until the sheet metal (the "carrier") leftover from the etching step of FIG. 3 is removed and the certain depth 302a of the gaps etched in FIG. 3 is reached. At this stage of the grinding step, the segments 303 become electrically isolated from each other and the passive surface of chips 401 becomes exposed. The grinding step creates a common planar device surface, where the passive surface of chips 401, the segments 303, and the compound-filled gaps are aligned in a common plane 530.

This stage of the grinding process is captured in FIG. 5A. It leaves the thickness 560 of the finished device at a value, which satisfies the specifications of many products. However, for other devices the grinding process may continue, see FIG. 5B, until a thinner predetermined thickness of the segments, the chips, and thus the overall device 561 is reached.

The device fabrication process may further include the step of attaching reflow metals, such as tin-based solders, to the segments and chips exposed at the planar device surface 530 to prepare for solder attachment of the device to external parts.

Figure 6:
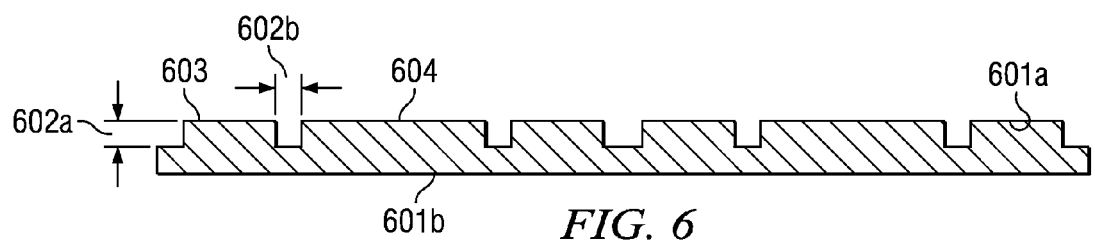

Referring now to the alternative process flow, FIG. 6 displays the metal sheet, after selected portions of the first sheet surface 601a have been etched so that the etched portions become gaps with a certain depth 602a and selected length 602b and width (not shown in the cross section of FIG. 6) between un-etched metal segments 603 and 604. The segments 603 are predetermined (metallurgically suitable) for attaching metal connectors on first surface 601a, and the segments 604 are predetermined (metallurgically suitable) for attaching semiconductor chips. The sheet portion left after the etch step acts as sort of "carrier" and includes the second surface 601b of the sheet.

Figure 7:
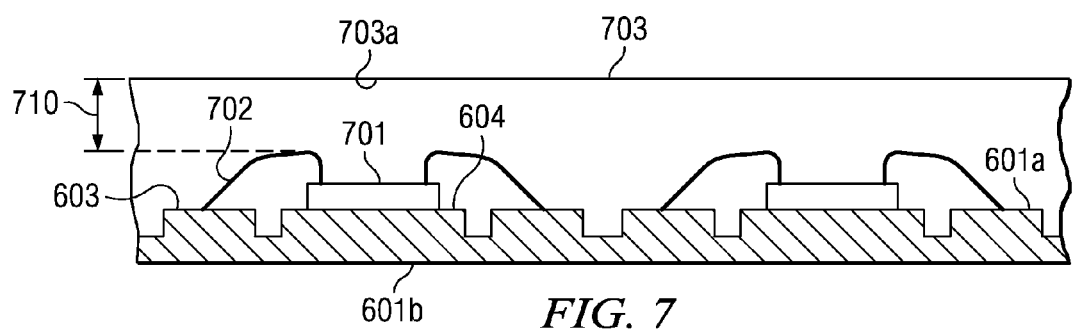

In the next process step, semiconductor chips with contact pads are provided; the number of required chips is determined by the final product (single chip or multi-chip device). Each chip is placed on a segment 604 of suitable length and width, and attached to the segment. FIG. 7 illustrates examples for chips 701 on segments 604. The thickness of chips 701 may be selected as required by the device type.

FIG. 7 also shows the next process step of interconnecting the chip contact pads with the respective segments 603 using conductive connectors 702. Preferred connectors are bond wires made of gold or gold alloy. In addition, FIG. 7 depicts the next process step of covering the first sheet surface 601a, the assembled chips 701, and the connectors 702 with a polymeric compound 703, preferably an epoxy-based molding compound; actually, compound 703 covers the connectors 702 to a height 710 over the wire span to ensure complete protection. For many devices, the top surface 703a of the encapsulation compound is preferably substantially planar and parallel to the second sheet surface 601b. Furthermore, compound 703 is filling the gaps. On the other hand, second sheet surface 601b remains uncovered by the encapsulation compound.

FIGS. 8A and 8B illustrate the mechanical grinding step at two completion stages, FIG. 8A at an earlier completion stage and FIG. 8B at a later completion stage. For the grinding process (described in more detail in conjunction with FIG. 9), a rotating grinding wheel 801 is used similar to the wheel conventionally used in the silicon wafer back-grinding process. The grinding process attacks the second sheet surface 601b (see FIG. 7) and continues to remove metal, until the sheet metal (the "carrier") is removed, which had remained from the etching step of FIG. 6, and the certain depth 602a of the gaps etched in FIG. 6 is reached. At this stage of the grinding step, illustrated in FIG. 8A, the segments 603 and 604 become electrically isolated from each other.

The grinding step creates a common planar device surface, in which the segments 603 and 604 and the compound-filled gaps are aligned; in FIG. 8A, this common plane is designated 830.

The thickness 860 of the finished device as depicted in FIG. 8A satisfies the specifications of many products. However, for other devices the grinding process may continue, see FIG. 8B, until a thinner predetermined thickness 861 of the segments and the overall device is reached.

The device fabrication process may further include the step of attaching reflow metals, such as tin-based solders, to the segments exposed at the planar device surface 830 to prepare for solder attachment of the device to external parts.

Figure 9:
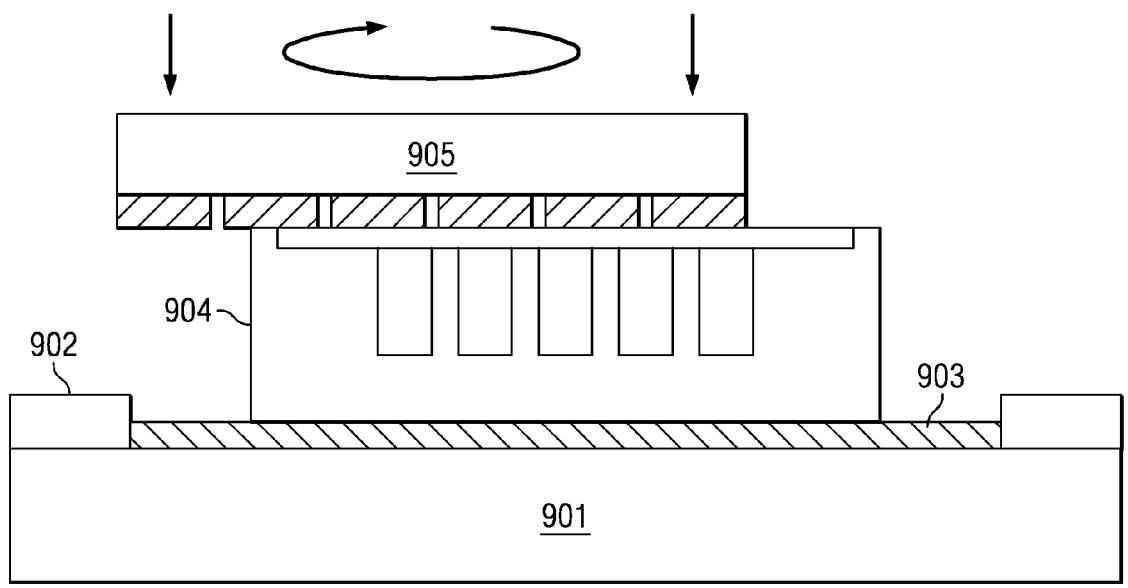
FIG. 9 is a cross section showing schematically the grinding system used by the method of the invention.

FIG. 9 shows schematically components of the back-grinding system used for the mechanical grinding process according to the invention. In principle, the system is similar to the ones installed in semiconductor manufacturing for back-grinding silicon wafers. Suitable back-grinding machines are commercially available, for example, from the companies Disco, TSK, and Okamoto, all of Japan. A vacuum chuck table 901 has a laminated flat ring 902, which holds a dicing film 903. This film is similar to the support film commonly used for silicon wafer back-grinding and serves to stabilize the molded leadframe-to-be-ground 904 against package warpage.

The grinding process is performed by rotating grinding wheel 905 under running water and controlled pressure and rotation speeds, without grinding powder. As an example, when wheel type G240-V by the company Disco is selected, the spindle may rotate at 3000 rpm. The first grinding speed of 0.3 μm/s is reached with a first table speed of 300 rpm. It is followed by a second grinding speed of 0.2 μm/s.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, or any other semiconductor or compound material used in integrated circuit manufacturing.

As another example, the invention applies to many semiconductor device types other than the example of an QFN/SON devices described, for instance surface mount devices, small outline devices, and leaded devices.

It is therefore intended that the appended claims encompass any such modifications or embodiment.

I claim:

1. A method for fabricating semiconductor devices comprising the steps of:
   providing a metal sheet having first and second surfaces;
   etching selected portions of the first surface of the metal sheet so that the etched portions become gaps having a certain depth and selected lengths and widths between un-etched metal segments, the metal segments suitable for attaching metal connectors;
   providing semiconductor chips having contact pads;
   attaching each semiconductor chip in a gap of suitable length and width;
   interconnecting the chip contact pads with respective metal segments using conductive connectors;
   covering the first surface of the metal sheet including the assembled chips and connectors, and filling the remaining gaps, with a polymeric compound; and
   removing metal of the second surface of the metal sheet until the certain depth of the gaps is reached, thereby electrically isolating the metal segments from each other and creating a planar device surface.

2. The method according to claim 1 further comprising a step of continuing the removing process until a first thickness of the metal segments and the semiconductor chips is reached.

3. The method according to claim 1 further comprising the step of attaching reflow metals to the semiconductor chips and metal segments exposed at the planar device surface to prepare for solder attachment of the device to external parts.

4. The method according to claim 1 wherein the step of removing uses a rotating grinding wheel under controlled rotation speeds, without grinding powder.

5. A method for fabricating semiconductor devices comprising the steps of:
   providing a metal sheet having first and second surfaces;
   etching selected portions of the first surface of the metal sheet so that the etched portions become gaps having a certain depth and selected lengths and widths between un-etched metal segments, the metal segments suitable for attaching semiconductor chips or metal connectors;
   providing semiconductor chips having contact pads;
   attaching each semiconductor chip on a metal segment of suitable length and width; interconnecting the semiconductor chip contact pads with respective metal segments using conductive connectors;
   covering the first surface of the metal sheet including the assembled semiconductor chips and connectors, and filling the gaps, with a polymeric compound; and
   removing metal from the second surface of the metal sheet until the certain depth of the gaps is reached, thereby electrically isolating the metal segments from each other and creating a planar device surface.

6. The method according to claim 5 further comprising the step of continuing the removing process until a first thickness of the metal segments is reached.

7. The method according to claim 5 further comprising the step of attaching reflow metals to the metal segments exposed at the planar device surface to prepare for solder attachment of the device to external parts.

8. The method according to claim 5 wherein the step of removing uses a rotating grinding wheel under controlled rotation speeds, without grinding powder.

9. A method for fabricating semiconductor devices comprising the steps of:
- etching portions of a top portion of a metal sheet to form a pattern of metal segments anchored on a bottom portion of the metal sheet;
- positioning a semiconductor chip between metal segments;
- covering the semiconductor chip and portions of the metal segments with a polymeric compound; and
- mechanically removing the bottom portion of the metal sheet to sever the metal segments.

10. The method of claim 9, in which the semiconductor chip is connected to the metal segments with conductive wires.

11. The method of claim 9, in which the semiconductor chip is positioned on one of the metal segments.

12. The method of claim 9, in which a mechanically removing is by grinding.

13. The method claim 12, further comprising attaching a reflow metal to the ground surface of the metal segments.

14. The method claim 12, in which the grinding is performed with a rotating grinding wheel.

* * * * *